United States Patent [19]
Hassner et al.

[11] Patent Number: 5,428,628
[45] Date of Patent: Jun. 27, 1995

[54] MODULAR IMPLEMENTATION FOR A PARALLELIZED KEY EQUATION SOLVER FOR LINEAR ALGEBRAIC CODES

[75] Inventors: Martin Hassner, Palo Alto, Calif.; Uwe Schwiegelshohn, Mohegan Lake; Shmuel Winograd, Scarsdale, both of N.Y.

[73] Assignee: International Business Machines Corporation, Armonk, N.Y.

[21] Appl. No.: 127,465

[22] Filed: Sep. 27, 1993

Related U.S. Application Data

[63] Continuation of Ser. No. 644,160, Jan. 22, 1991, abandoned.

[51] Int. Cl.$^6$ .................................. H03M 13/00
[52] U.S. Cl. .................................... 371/37.1
[58] Field of Search ........................ 371/37.1

[56] References Cited

U.S. PATENT DOCUMENTS 4,845,713  7/1989  Zook ........................ 371/37

OTHER PUBLICATIONS

Clark, G. et al., *Error–Correction Coding for Digital Communications*, Plenum Press, 1982, pp. 201–214.
Blahut, R., *Theory and Practice of Error Control Codes*, Addison–Wesley Publishing Co., 1984, pp. 183–191.
Whiting, D., *Bit–Serial Reed–Solomon Decoders in VLSI*, PhD Thesis, California Institute of Technology, Pasadena, 1984, pp. 62–68, 104.
E. R. Berlekamp, "Algebraic Coding Theory", McGraw–Hill, 1968, pp. 178–199.
J. L. Massey, "Shift–Register Synthesis and BCH Decoding", IEEE Transactions on Information Theory, vol. IT-15, No. 1, Jan. 1969, pp. 122–127.
K. Y. Liu, "Architecture for VLSI Design of Reed–Solomon Decoders", IEEE Transactions on Computers, Feb. 1984, pp. 178–189.
R. T. Chien, "Cyclic Decoding Procedures for Bose–Chaudhuri–Hocquenghem Codes", IEEE Transactions on Information Theory-10, Oct. 1964, pp. 357–363.

Primary Examiner—Stephen M. Baker
Attorney, Agent, or Firm—Henry E. Otto, Jr.

[57] ABSTRACT

Apparatus and method for implementing a parallelized algorithm for solving the key equation for the decoding of a linear algebraic code. Circuitry implements two computation sequences. One of these executes three multiplication operations and the other executes five multiplication operations, 2t iterations of these two sequences being required to decode t symbols in error. These sequences are coupled such that during each successive 2t iterations, four multiplication operations are executed simultaneously in pairs, the fifth multiplication operation in the other sequence being paired with a multiplication operation in the next iteration of the one sequence. During one of the paired multiplication operations an inverse table look up operation is executed, and during another of the multiplication operations an addition operation is executed. Two consecutive executions of the other sequence are prevented.

2 Claims, 15 Drawing Sheets

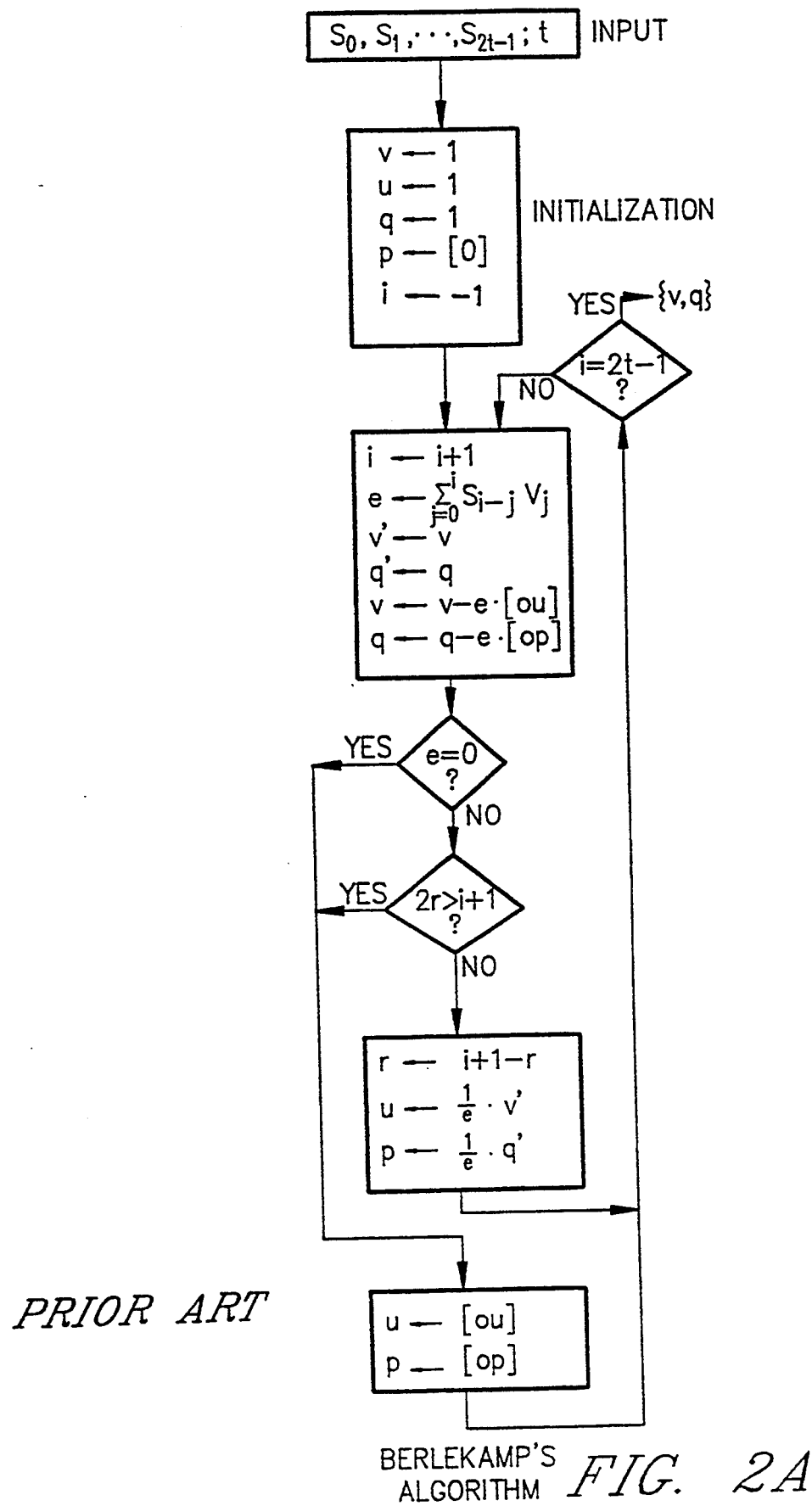
FIG. 2A BERLEKAMP'S ALGORITHM — PRIOR ART

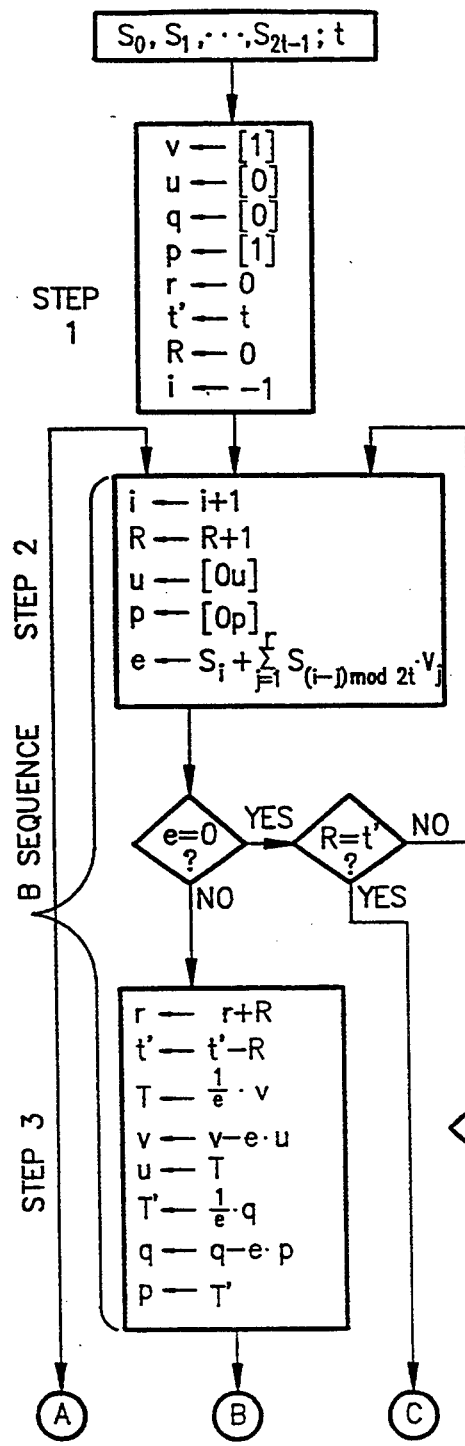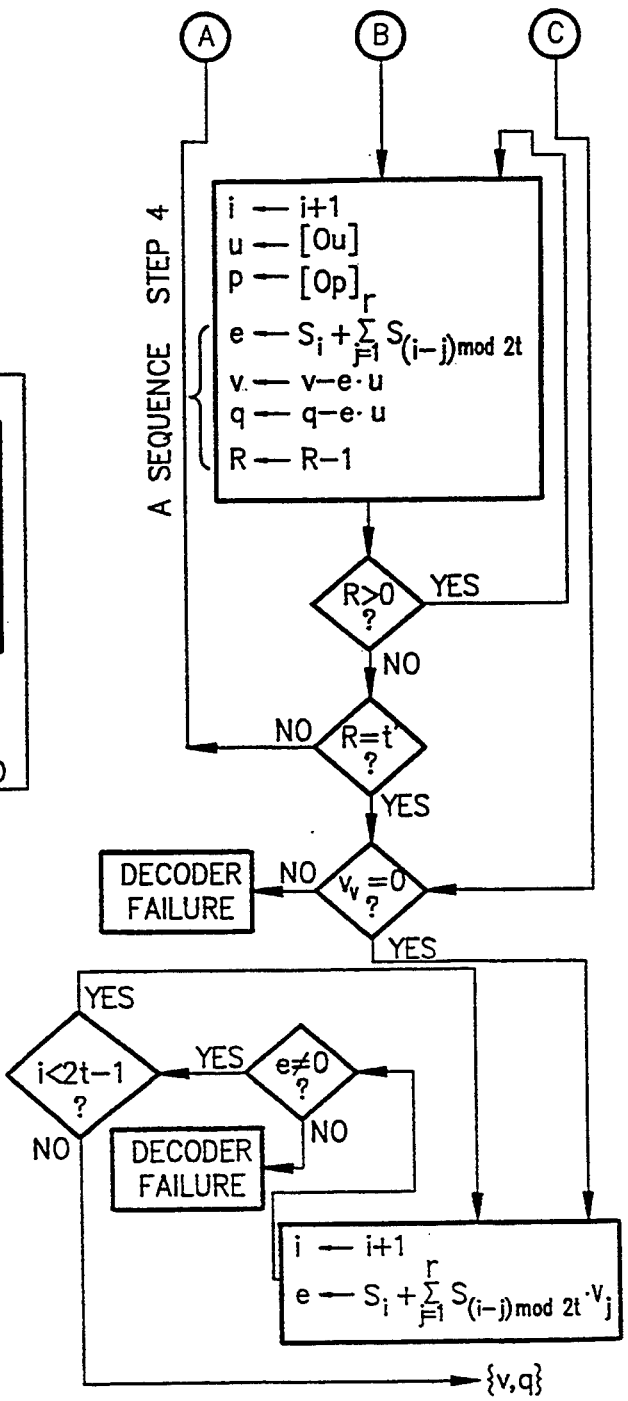
APPLICANTS' NEW ALGORITHM
*FIG. 2B-1*   *FIG. 2B-2*

APPLICANT S' MODIFIED ALGORITHM

INPUT
$S_0, S_1, \ldots, S_{2t-1}; \, t;$

INITIALIZATION
$v, p \leftarrow [00000001];$
$u, q \leftarrow [00000000];$
$r \leftarrow 0;$

LOOP
FOR $i = 0$ TO $2t-1$ DO
BEGIN
$e \leftarrow \sum_{j=0}^{r} S_{(i-j) \bmod 2t} \cdot v_j;$
$v' \leftarrow v;$
$q' \leftarrow q;$
$v \leftarrow v - e \cdot [ou];$
$q \leftarrow q - e \cdot [op];$

CONDITIONAL JUMP
IF $e = 0$ or $2R \geq i+1$ THEN
$\quad u \leftarrow [ou];$
$\quad p \leftarrow [op];$
ELSE
$\quad r \leftarrow i + 1 - r;$
$\quad u \leftarrow \frac{1}{e} \cdot v';$
$\quad p \leftarrow \frac{1}{e} \cdot q';$
ENDIF;
END;

*FIG. 3*

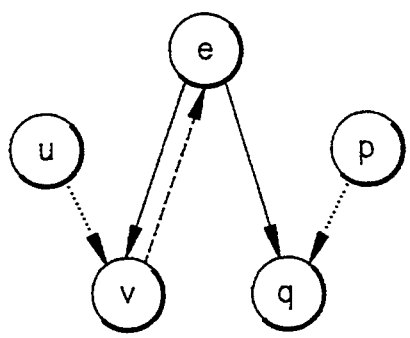

*FIG. 5A*

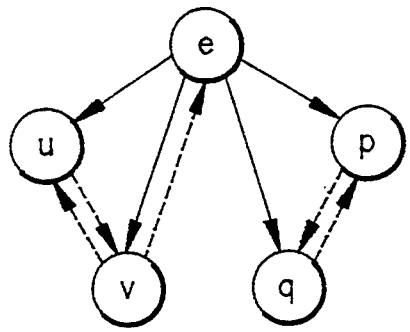

*FIG. 5B*

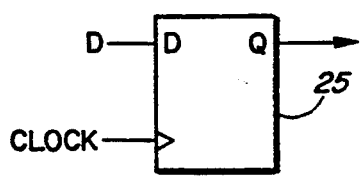
FIG. 7A
| CLOCK | Q | Q̄ |
|---|---|---|
| 1 | D | D̄ |
| 0 | PREVIOUS Q | PREVIOUS Q̄ |
FIG. 7B
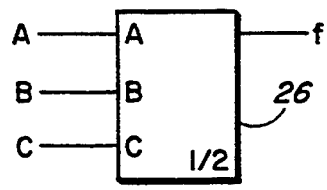
FIG. 8A
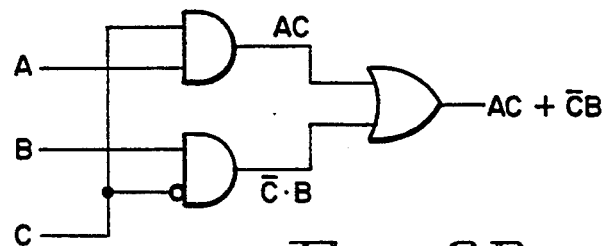
FIG. 8B
| C | f |
|---|---|
| 1 | A |
| 0 | B |
FIG. 8C

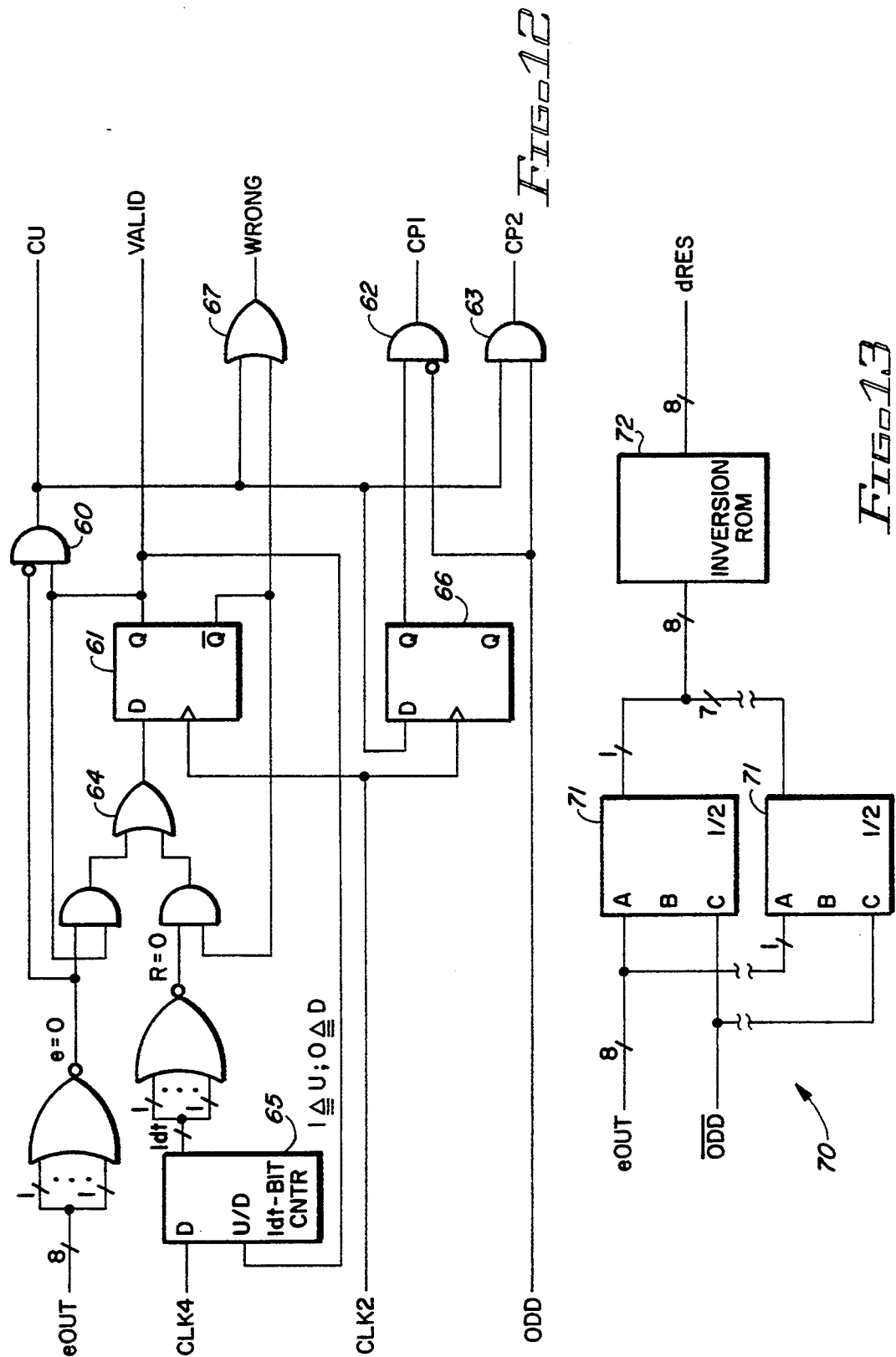

| INPUT SIGNALS | CLOCK (1) |
| | INPUT (1) |
| | s1EXT (64) |
| | s2EXT (72) |
| OUTPUT SIGNALS | vOUT (72) |
| | qOUT (72) |
| | VALID (1) |
| | END (1) IF NECESSARY FOR CHIEN SEARCH |

| | | |
|---|---|---|
| CLK2 | = | ODD AND SYSTEM CLOCK |
| CLK4 | = | $\overline{ODD}$ AND SYSTEM CLOCK |
| CLK3 | = | CLK2 OR (CU AND CLK4) |
| CLK1 | = | CLK2 OR (INPUT AND SYSTEM CLOCK |
FIG. 16A
| | s | u | v | p | q |
|---|---|---|---|---|---|
| SCALING | 0 | CU | 0 | CP2 | 0 |
| SHIFTING | $\overline{INPUT}$ | $\overline{CU}$ | 0 | $\overline{CP2}$ AND $\overline{CP1}$ | 0 |
| LOADING/STORING | INPUT | 0 | 0 | CP1 | 0 |
| UPDATE | 0 | 0 | 1 | 0 | 1 |
| | CLK1 | CLK4 | CLK4 | CLK3 | CLK2 |
FIG. 16B
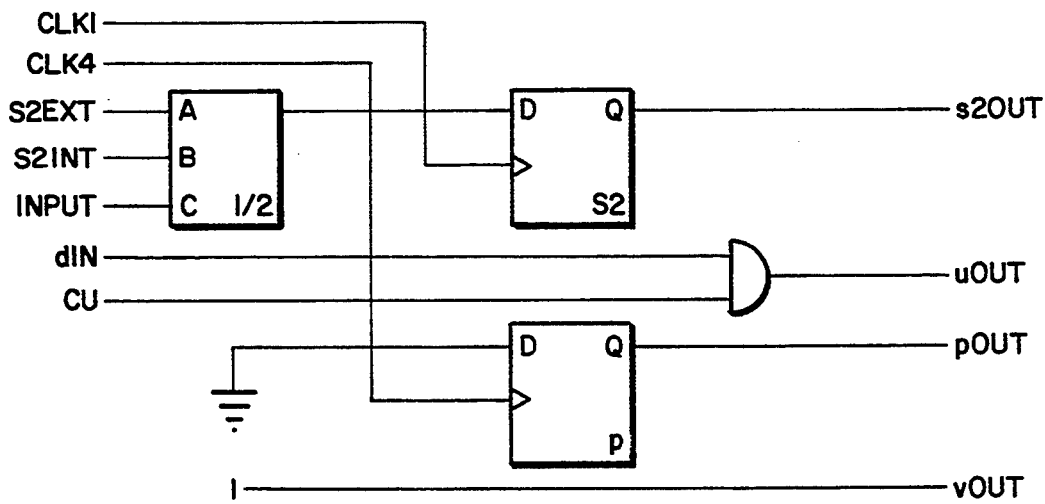
FIG. 17A
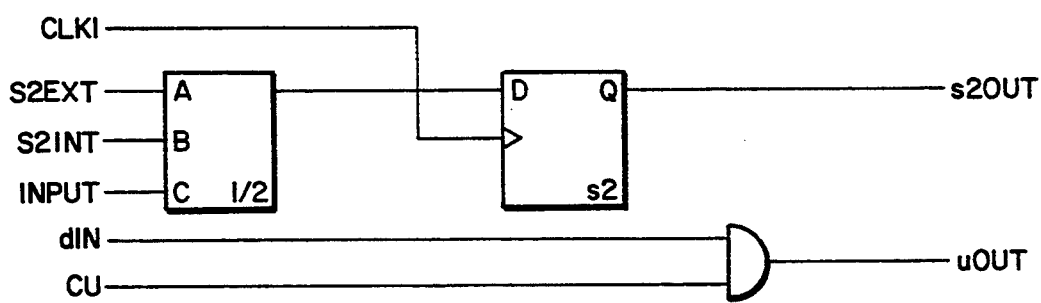
FIG. 17B

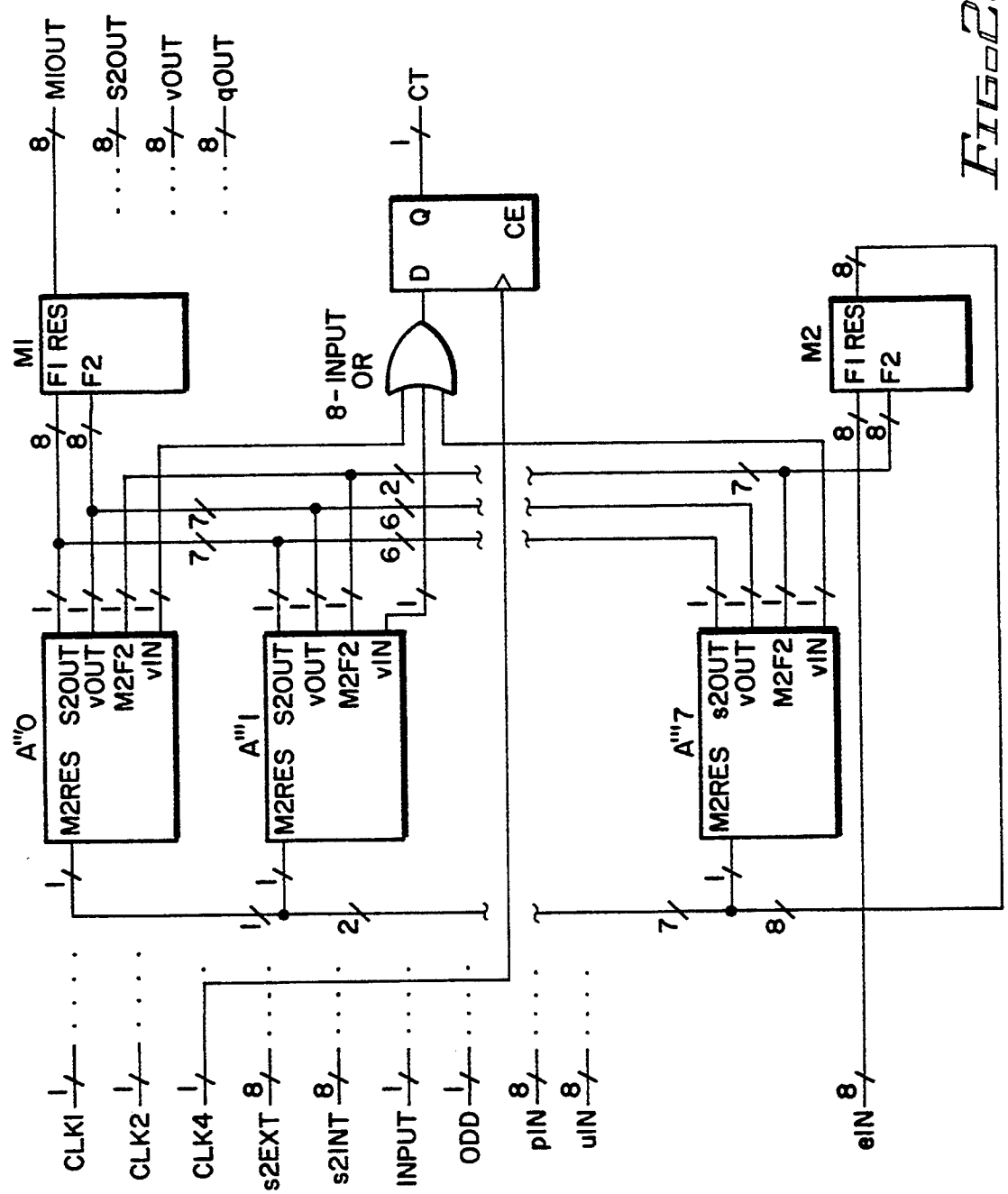

MODULAR IMPLEMENTATION FOR A PARALLELIZED KEY EQUATION SOLVER FOR LINEAR ALGEBRAIC CODES

This is a continuation of application Ser. No. 644,160 filed on Jan. 22, 1991, now abandoned.

This invention relates to an apparatus and method for decoding linear algebraic codes, and more particularly to an apparatus and parallel computation method that solves the key equation for decoding of Reed-Solomon (RS) codes by use of an algorithm that improves latency without requiring additional hardware over that employed in prior art apparatus for solving said equation.

BACKGROUND OF THE INVENTION

The following prior art references are considered by applicants to be the most pertinent to the present invention:

[A] E. R. Berlekamp, "Algebraic Coding Theory," McGraw Hill, pp. 178–199, 1968;

[B] J. L. Massey, "Shift-Register Synthesis and BCH Decoding," IEEE Trans. on IT, IT-15; January 1969;

[C] K. Y. Liu, "Architecture for VLSI Design of Reed-Solomon Decoders," IEEE Trans. on Computers, February 1984, pp. 178–189.

[D] D. L. Whiting, "Bit-Serial Reed-Solomon Decoders in VLSI," PhD thesis, California Institute of Technology, 1984; and

[E] R. T. Chien, "Cyclic Decoding Procedures for BCH Codes," IEEE Trans. on IT-10, pp. 357–363, October 1964.

At p. 184 in reference [A], Berlekamp discloses an algorithm for solving the "key equation" which is the main step in decoding RS codes. As hereafter used in the specification and claims, the term "key equation" is defined as the equation which must be solved to determine the coefficients for the error locator and error evaluation polynomials for a given set of error syndromes. Berlekamp's algorithm, for the simultaneous computation of both error locator and evaluator polynomial coefficients, consists of a computational sequence with one conditional branching condition that divides the sequence into two straight-line sequences, hereafter referred to as the A and B sequences, respectively. The decoding of t symbols in error requires 2t iterations or traversals of this sequence. The A-sequence executes three multiplications and the B-sequence executes five multiplications.

In reference [B], Massey proposed splitting Berlekamp's algorithm by first computing the error location coefficients. These are then used in the computation of the error evaluation polynomials.

Reference [C] describes an implementation of the "Berlekamp-Massey" algorithm disclosed in reference [B]. However, this implementation requires $4t+1$ multipliers, 6t registers +t registers for the remaining syndromes and a total of 6t multiplication delays for the computation of error locator and error evaluator polynomials. Furthermore, this reference does not disclose or suggest implementation using bit slice circuits.

In reference [D] at pp. 65 and 104, Whiting noted some arbitrariness in the statement of the conditional branching of Berlekamp's algorithm. Whiting also indicated that a parallel implementation of Berlekamp's algorithm would involve storing twice as many polynomial coefficients and either an additional multiplier or time-multiplexing a single multiplier as compared with the hardware resources required by the parallelization of the algorithm as modified in reference [B].

SUMMARY OF THE INVENTION

According to the invention, the key equation for the decoding operation is parallelized without requiring additional hardware over that required in reference [B] by effectively removing the arbitrariness in the branching condition.

Applicants' algorithm removes the arbitrariness of the branching condition in a way that the sequence executing five multiplications cannot directly repeat. This sequence is coupled with the following sequence executing only three multiplications such that now two iterations require eight multiplications resulting in an average of four multiplications per sequence iteration. This coupled sequence structure is illustrated in hardware, modular in form, to facilitate implementation in VLSI (very large scale integration).

BRIEF DESCRIPTION OF THE DRAWINGS

FIGS. 2A and 2B-1/2B-2 constitute a side-by-side detailed comparison of Berlekamp's prior art key equation solving algorithm and of applicants' modified algorithm;

FIG. 3 constitutes a condensed representation of applicants' modified key equation solving algorithm;

FIGS. 5A and 5B describe the multiplication dependence diagrams for both A and B sequences that are executed by the key equation solver algorithm;

FIGS. 7A and 7B depict a block diagram of a latch and a tabulation of its states, respectively;

FIGS. 8A, 8B and 8C depict a block diagram of a multiplexor, a circuit diagram thereof and a tabulation of its states, respectively;

FIG. 12 is a schematic diagram of a control signal circuit;

FIG. 13 is a schematic diagram of an inversion circuit;

FIGS. 16A and 16B are, respectively, a tabulation showing the conditions under which each of the clocks is active, and a matrix showing the relationship between the shift registers containing the different variables and the different operations performed thereon;

FIGS. 17A and 17B are schematic diagrams of initialization bit slice circuits for the first input data bit to a syndrome latch and for the seven remaining bits, respectively;

FIG. 20 is a schematic diagram of a terminal byte slice of the error correction unit.

INTRODUCTION

Assume a Galois field of 256 elements, GF ($2^8$), whose elements correspond to 8-bit bytes. Thus the algorithm according to the invention and its hardware implementation operate on bytes using modulo-2 Galois field arithmetic; and the input data are 2t bytes, assumed, for illustration, to be the syndromes for a RS code, where t is the number of errors to be corrected.

As hereinafter used in the specification and claims, the term "bytes" is used for ease of understanding and is to be considered merely as illustrative, as the invention may be implemented with symbols pertaining to other fields.

According to the invention, the key equation solving circuitry is modified to provide a parallelized algorithm and a modular hardware implementation for solving the key equation for the decoding of a linear algebraic code, such as the RS code.

Assume that, as above, t=the number of errors to be corrected, and that v, u, p, q and S are single variable polynomials. The key equation is the congruence:

$$v(z) \cdot S(z) \equiv q(z) \bmod(z^{2t})$$

whose solution, provided it exists, is the rational function:

$$r(z) = \frac{q(z)}{v(z)}.$$

A given set of syndromes $\{S_i\}_{i=0}^{2t-1}$ for a linear algebraic code may be viewed as the coefficients of a polynomial S(z). The roots of the denominator polynomial v(z) in the key equation solution are the error locations and the residues of r(z) at these roots are the error values.

DESCRIPTION OF PREFERRED EMBODIMENT

Figure 1:
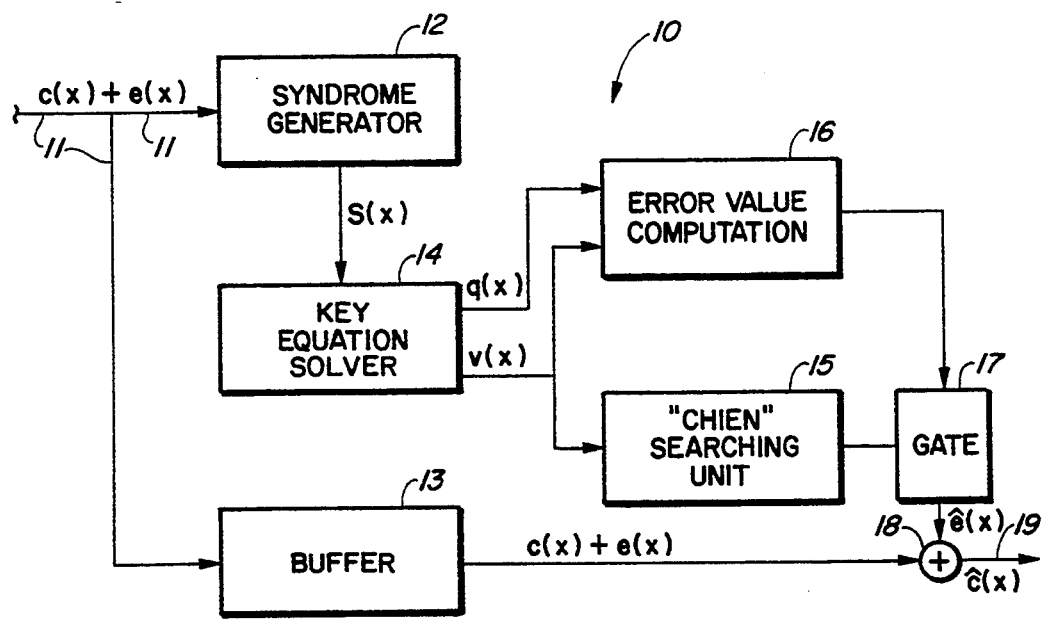
FIG. 1 is a block diagram of an apparatus embodying the invention for decoding a linear algebraic code.

As illustrated in FIG. 1, the apparatus embodying the invention comprises a decoder 10 for decoding a linear algebraic code, such as a Reed-Solomon (RS) code. A noisy codeword c(x), including any error pattern e(x), is supplied via a line 11 to a syndrome generator 12 and a buffer 13. The syndrome output S(x) from generator 12 passes to a key equation solving circuit 14.

According to the invention, circuit 14 outputs an error locator polynomial v(x) and an error evaluation polynomial q(x) for the particular set S(x) of error syndromes to a "Chien" searching circuit 15 and an error value computation circuit 16, respectively. Circuit 15 preferably is of the type disclosed in Reference [E]. The output of circuits 15 and 16 are gated at 17 to provide an output ê(x) representing the estimated error pattern. This output ê(x) is summed at 18 with the output from buffer 13 (which corresponds to the codeword plus error pattern input to the buffer from line 11) to provide in line 19 a corrected codeword c (x).

Thus, given S (the syndrome polynomial) and t (the number of errors to be corrected), the equation solving circuitry 14 derives v and q (the error locator and error evaluation polynomials, respectively).

In Reference [D] Whiting considered the hardware and latency that would be involved if the serial key equation solver algorithms of References [A] and [B] were parallelized. Table 1 is a performance comparison of Whiting's versions 1 and 2 for parallelizing Berlekamp's algorithm described in Reference [A] and the so-called Berlekamp-Massey (BM) algorithm described in Reference [B] with applicants' algorithm.

TABLE 1

|  | Multipliers | Storage | Latency |
| --- | --- | --- | --- |
| B Version 1 | 3t | 6t | 4t |
| B Version 2 | 2t | 6t | 6t |
| BM | 2t | 6t | 6t |
| Applicants' | 2t | 6t | 4t |

APPLICANTS' ALGORITHM IN DETAIL

Applicants' distinctive algorithm receives as input a data vector of 2t field elements $[S_0, \ldots, S_{2t-1}]$ and produces as output $[v_0, \ldots, v_{t-1}]$, and $[q_1, \ldots, q_{t-1}]$, which are the coefficients of the denominator and numerator of a rational approximant to S(z) which generally may be viewed as a power series whose coefficients are the field elements $\{S_i\}$. For an input vector of 2t field elements, the denominator degree of the rational approximant produced cannot exceed t. The degree of the numerator polynomial is strictly smaller than that of the denominator polynomial. The algorithm terminates after 2t iterations.

FIG. 3 and in more detail FIG. 2B are flow charts of applicants' algorithm. The computation is divided into five steps as follows:

Step 1 (Initialization).

v←[1]
u←[0]
q←[0]
p←[1]
r←0
t'←t
R←0
i←−1

In Step 1 the vector variables v, u, p and q are initialized. Each of these vectors has t components. The convention used above assigns the "all zeros" vector to u and q, whereas the least significant coefficient of both v and p are assigned the value 1 and the other coefficients are 0. The scalar variable i used to count the number of iterations is initially assigned the value −1. The scalar variable r counts the number of times Step 2 of the algorithm is performed, whereas the scalar variable R counts the difference in the number of times Step 2 and Step 4 are performed. The scalar variable t' used to decide on termination of the algorithm is initiated as t, the number of errors which are correctable.

Step 2 (Linear Dependence Test)

i←i+1
R←R+1
u←[0u]
p←[0p]

$$e \leftarrow S_i + \sum_{j=1}^{i} S_{(i-j) \bmod 2t} V_j$$

In Step 2, i and R are incremented by 1, and u and p are shifted to the right by one position (indicated in the above convention as substituting the contents of the vector by a vector to which a 0 has been appended at the right). The main computation performed in Step 2 is the convolution of the content of the S vector with the content of the v vector resulting in the value e, which is generally known as the "discrepancy" (see Reference [A]). In effect this computation checks whether the syndromes as weighted by the current value of v are linearly independent. If e=0, then the syndromes as so weighted is linearly dependent. In such case, Step 2 is repeated as shown in FIG. 2. The algorithm continues to Step 3, provided e≠0.

Step 3 (Update)

r←r+R
t'←t'−R $$T \leftarrow \frac{1}{e} v$$

v←v−eu
u←T $$T \leftarrow \frac{1}{e} q$$

q←q−ep
p←T'

In Step 3, the scalar variables r and t' are stepped up and down respectively by R, which is the number of times Step 2 was performed. The content of v is updated by subtracting from its current value the previous value of u multiplied by the non-zero discrepancy e which was computed in Step 2.

The current (not updated) value of v is simultaneously used to update the value of u through the intermediary variable T that temporarily stores the current value of v divided by the non-zero discrepancy e.

Thus, in Step 3, both v and u are updated using their previous values and the discrepancy e.

In a completely analogous manner q and p are updated using an intermediary variable T'. The updating Step 3 is not repeated and unconditionally leads into Step 4.

Step 4 (Polynomial Iteration)

i←i+1
u←[0u]
p←[0p]

$$l \leftarrow S_i + \sum_{j=1} S_{(i-j) \bmod 2t} V_j$$

v←v−eu
q←q−ep
R←R−1

In Step 4, the iteration count variable i is incremented and at the same time the value of R is decreased. As long as R is greater than 0, step 4 will be repeated until R is 0; whereupon the program control statement will take the computation back to Step 2, as shown in FIG. 2B and FIG. 3.

Upon initiation of Step 2, the algorithm checks how many times Step 2 has been performed by comparing the value of R with the threshold value t'. If R=t', the algorithm will proceed to Step 5 which is the "Exit Test."

Step 5 (Exit Test)
i←i+1

$$e \leftarrow S_i + \sum_{j=1} S_{(i-j) \bmod 2t} V_j$$

Once entered, Step 5 will produce either a "Not Correctable" exit or will produce the error locator and error evaluator polynomial coefficients; i.e., the vectors v and q, respectively.

Comparison of Berlekamp's and Applicants' Algorithms

The differences between Berlekamp's algorithm and applicants' improved algorithm can be noted from the side-by-side comparison in FIGS. 2A and 2B. The main difference between Berlekamp's and applicants' algorithms lies in the number of multiplications to be executed. In the case where the discrepancy "e" always differs from zero, Berlekamp's algorithm requires five multiplications per e-computation; whereas in applicants' algorithm, four pairs of multiplication operations are performed, with each pair performed as two parallel multiplications. Applicants' algorithm differs from Berlekamp's in the following respects which are apparent from comparison of FIGS. 2A and 2B: (1) in the initialization step; (2) in the "discrepancy" e-computation; and (3) in the sequence branching condition.

Figure 4:
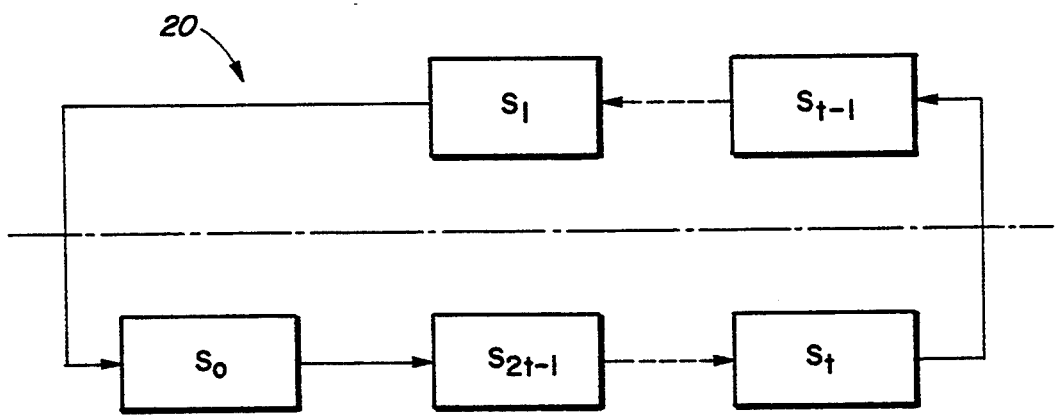
FIG. 4 is a diagram of a two "level" circular shift register used in the implementation of applicants' parallelized algorithm.

The e-computations in Berlekamps' algorithm and in applicants' algorithm differ in that Berlekamp's variable summation is replaced in applicants' algorithm by a fixed summation which is translated into a circular shift register 20 (FIG. 4) for processing the input vector [$S_0$, $S_1$ . . . , $S_{2t-1}$]. Shift register 20 has two "levels," an upper level S1 and a lower level S2. All the latches of shift register 20 are initially loaded in parallel, in the locations denoted in FIG. 4. This feature is essential in order to implement a parallelized algorithm for solving the key equation.

According to an important feature of the invention, and unlike Berlekamp's algorithm, Step 3 of applicants' algorithm cannot repeat. More specifically, between two consecutive executions of Step 3 there is at least one execution of Step 4 and one execution of Step 2.

Applicants' algorithm, as shown in FIG. 2B, is transformed into a sequence of A- and B-sequences, which are described in Table 2. Steps 2 and 3 of applicants' algorithm are combined into a B-sequence, as shown in FIG. 2B. Similarly, Step 4 becomes an A-sequence, again as illustrated in FIG. 2B. Moreover, by introducing redundant multiplications, such as multiplication by zero, Step 5 and Step 2 are transformed into an A-sequence as well. In this fashion, the entire algorithm of applicants' executes sequences of A- and B-sequences.

TABLE 2

"IF" (TYPE A SEQUENCE)

$$e \leftarrow S_i + \sum_{j=1}^{r} S_{i-j} V_j$$

v ← v − e[0u]
q ← q − e[0p]

"ELSE" (TYPE B SEQUENCE)

$$e \leftarrow S_i + \sum_{j=1} S_{(i-j)} \text{ med } 2t \, V_j$$

v ← v − e[0u]
q ← q − e[0p]

TABLE 2-continued $$u \leftarrow \frac{1}{e} v'$$

$$p \leftarrow \frac{1}{e} q'$$

As will be noted in FIG. 3B, in applicants' sequence structure the conditional branching control condition has been changed to "If e=0 or 2r≧i+1 then." This change prevents the "Else" condition from recurring consecutively and thus prevents a B-B sequence (Table 2) from occurring. In other words, as will be noted from FIG. 2, Step 3 cannot repeat.

The optimum speed-up achievable by parallelization for applicants' algorithm is derived by considering an operational dependence graph. In a hardware implementation, the only time consuming arithmetical operations considered are multiplications, which are represented in the form of an edge in the dependence graph. FIGS. 5A and 5B show the multiplication dependence graphs for a type A-sequence and for a type B-sequence, respectively. The nodes connected by an edge are labelled by the variables that are being multiplied.

At the beginning of the algorithm the variables have their initial values. As illustrated in FIGS. 5A and 5B, the variable at the "tail" node is a factor of the variable at the "head" node. On this (multiplication) dependence graph, all nodes have two entries representing two factors except for the node e, where one factor will always be a syndromes vector. All full-line edges denote dependencies within the same iteration, while dashed edges represent dependencies between the current and the immediately preceding iteration. The dotted edges denote dependencies between the current and any preceding iteration.

As all edges have a unit weight representing a multiplication time, the critical cycle is established by determining Maximum(cycle length/number of dashed edges in the cycle)=Δ. For both algorithms, the critical cycle is e→v→e(next iteration) with Δ=2. Consequently, a lower bound of the latency time is two multiplication times/iteration.

The number of multipliers necessary for achieving this minimal time must now be determined. As the latency time is required to be optimal, the worst case of the iterations must be considered. The syndrome inputs are therefore assumed to have values that do not permit any multiplier savings in early iterations. The node variables from the dependency graph are considered to be scalars. Each vector contains t nontrivial symbols and the number of multipliers in the vector case is the t-fold of the number of multipliers in the scalar case.

With applicants algorithm, a type B-sequence requires five multiplications while three multiplications are sufficient for a type A-sequence. In Berlekamp's algorithm, a sequence of only B-sequences will occur if e≠0 during the whole algorithm. Therefore, the minimal number of multipliers necessary for achieving a latency time of two multiplication cycles/iteration is 3 for Berlekamp's algorithm.

According to the invention, applicants' have combined a type B-sequence with the following type A-sequence thus resulting in a requirement of eight multiplications for two iterations. It is sufficient to consider the following two sequences A and B-A and all their combinations A-A, A-B-A, B-A-A and B-A-B-A. With applicants' algorithm, and as previously stated, a sequence B-B is not possible (see FIG. 2).

From FIGS. 5A and 5B, it is obvious that all the combinations mentioned result in a valid schedule. It should be noted that if the last iteration is of type B, the updating of u and p becomes redundant. Consequently, the applicants' algorithm can be executed in 4t+1 multiplication cycles requiring 2t multipliers. In fact, it is possible to reduce the number of multiplication cycles by two if the initial conditions of the data vectors are exploited.

Hardware Implementation

Figure 6:
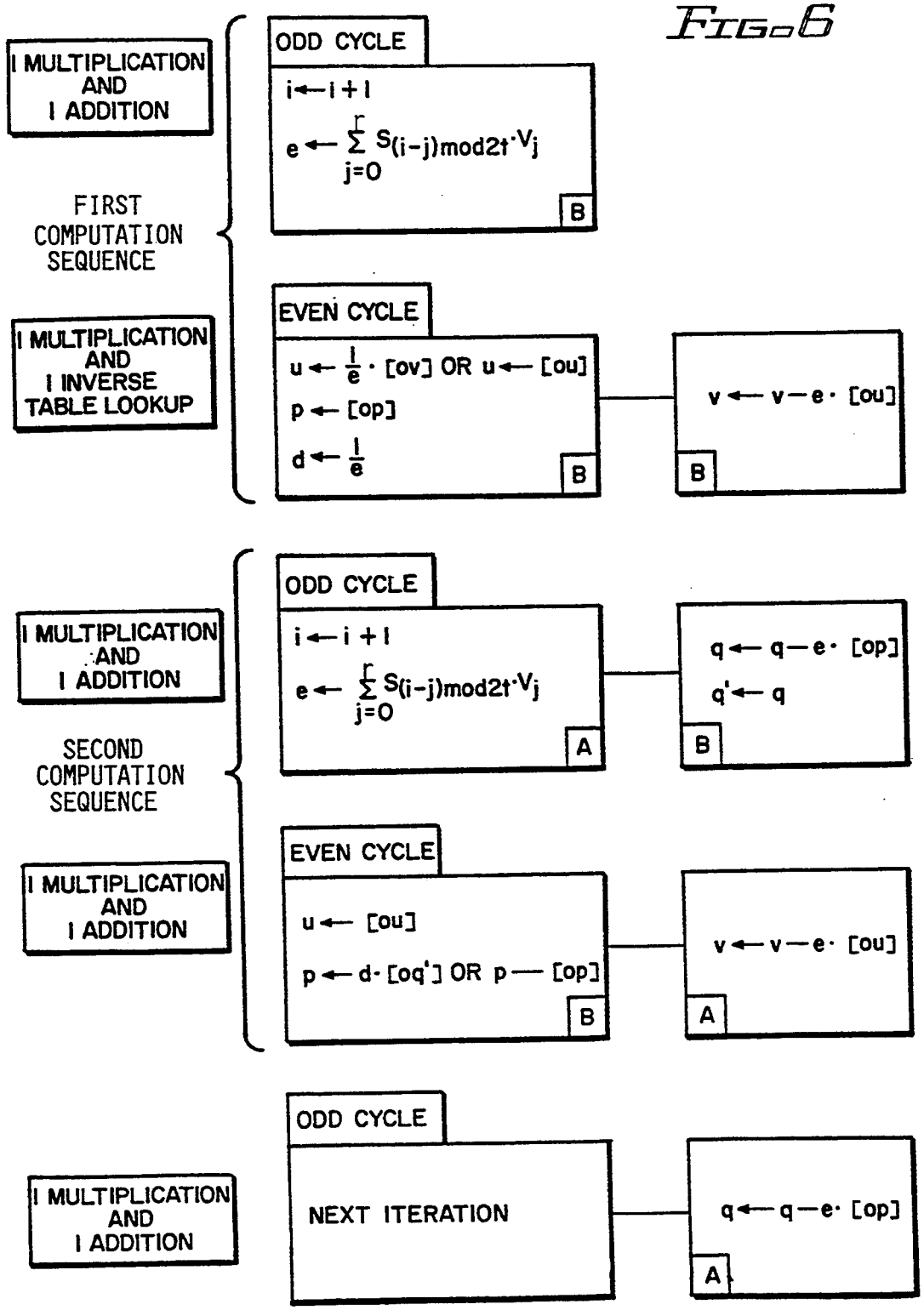
FIG. 6 is a schedule of a parallelized algorithm according to the invention, depicting the coupling of the A and B sequences, during two successive iterations, each comprising an odd and even cycle.
Figure 21A:
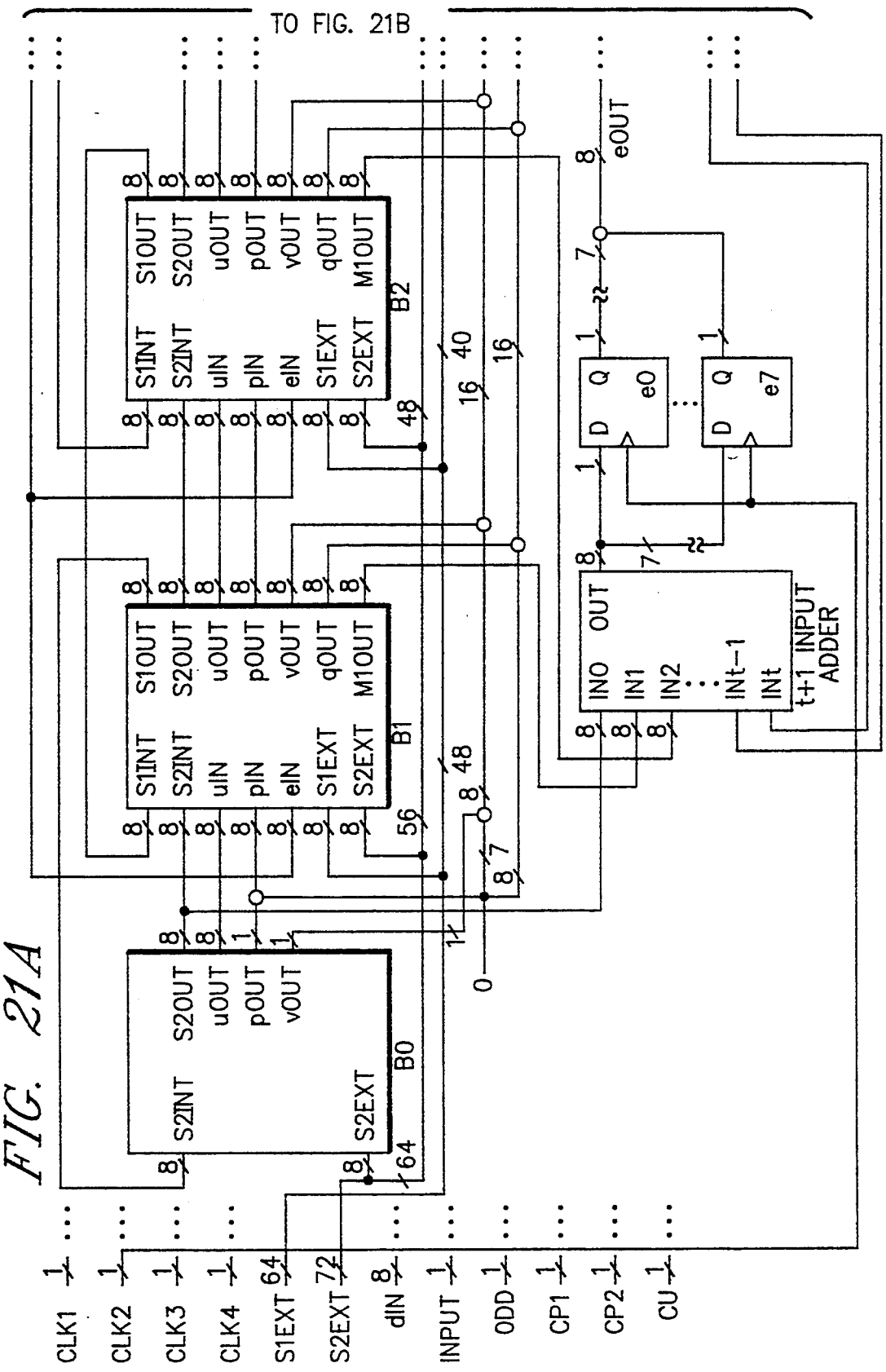
FIGS. 21A and 21B, when taken together such that right edge of FIG. 21A is matched to the left edge of FIG. 21B constitute a schematic diagram of a complete correction unit for t=8.
Figure 21B:
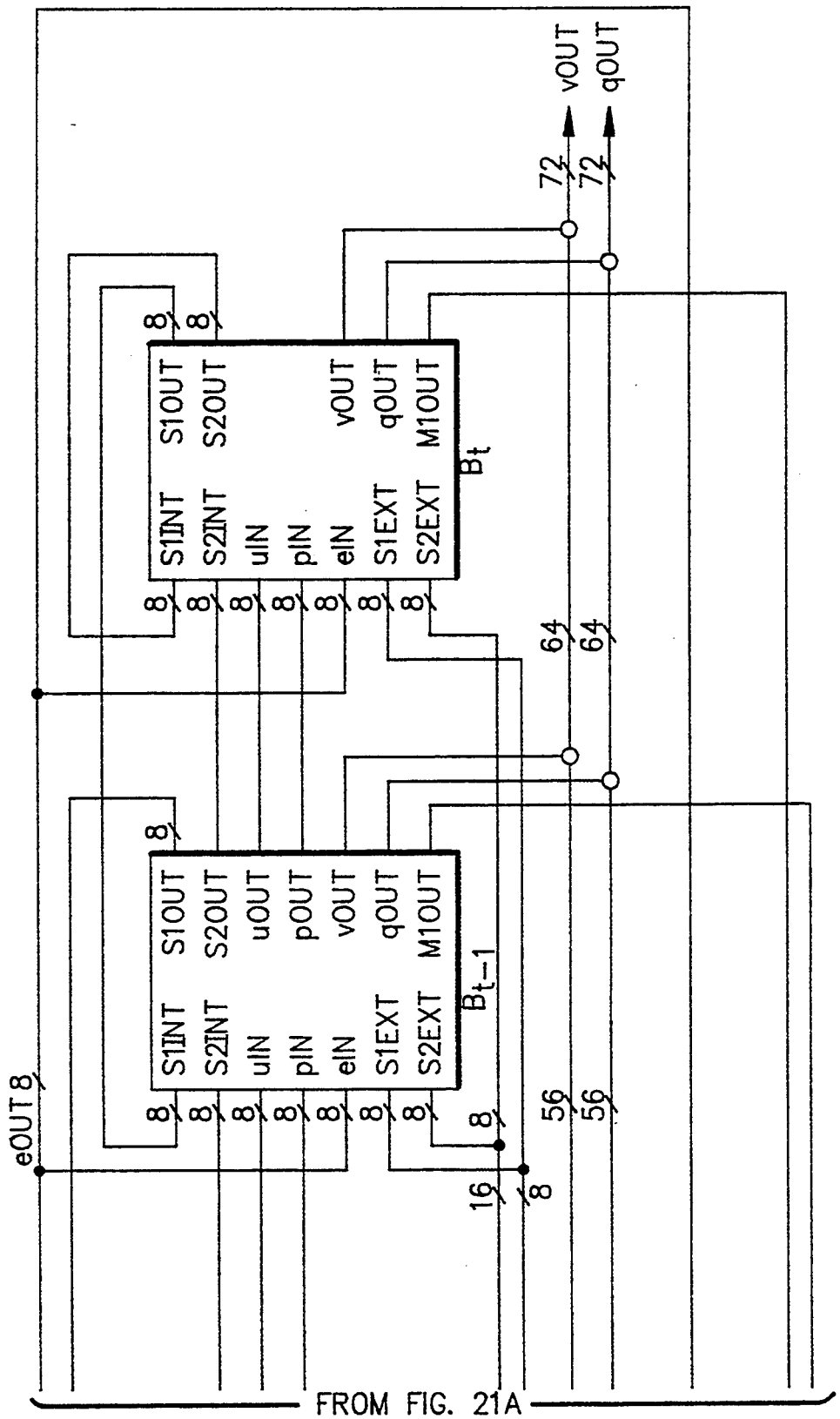

To achieve a simple and homogenous hardware implementation, a common schedule is generated for type B-A and type A or A-A sequences. This schedule is given in FIG. 6. FIG. 6 shows how applicants achieve parallelism by changing the sequence of operations of the algorithm. Note that for all sequences of discrepancy values (not just some), at most four pairs of multiplication operations are performed, with each pair performed as two parallel multiplications. Using this schedule, a modular design has been derived for the entire correction unit of applicants' key equation solving circuitry 14. The correction unit is depicted in FIG. 21 and is built up, using elementary logic units and modules now to be described.

FIG. 7A schematically denotes a latch 25 and FIG. 7B the latch outputs corresponding to various input conditions. FIG. 8A schematically denotes a multiplexor circuit 26, shown more completely in FIG. 8B to provide the outputs tabulated in FIG. 8C.

Figure 9:
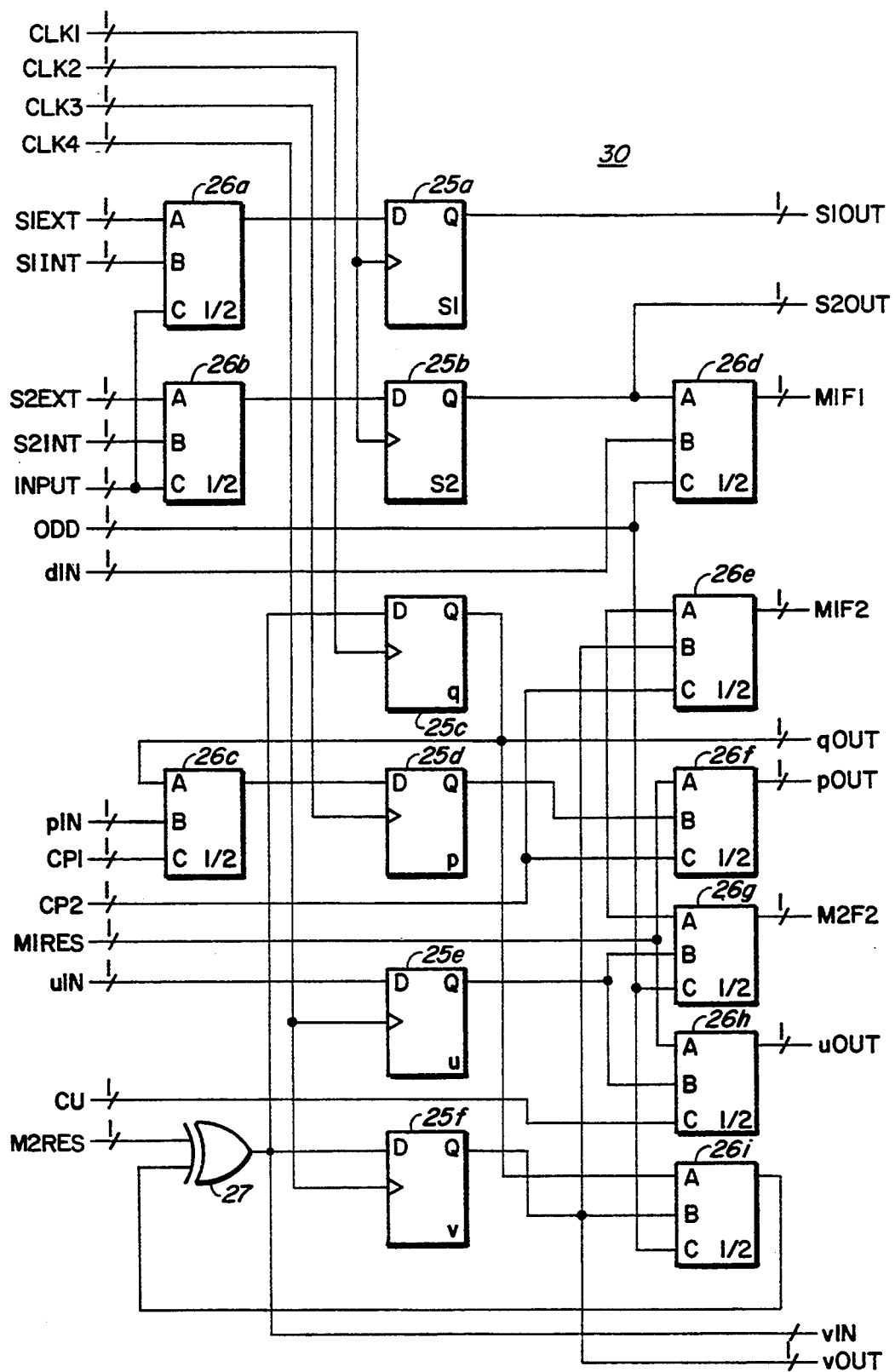
FIG. 9 is a schematic diagram of a bit slice circuit of applicants' correction unit.
Figure 10:
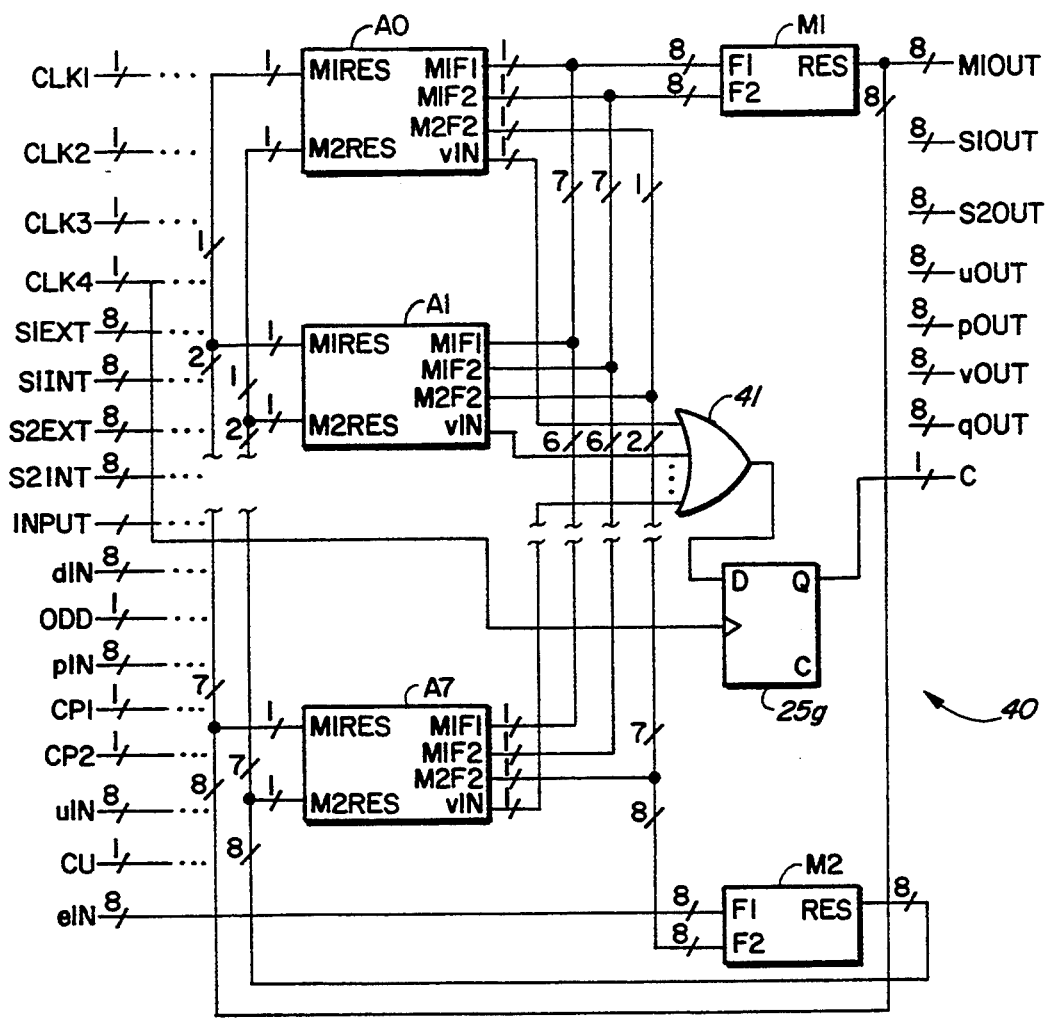
FIG. 10 is a schematic diagram of a modular byte slice circuit of the correction unit.

According to a feature of the invention, and as illustrated in FIG. 9, a bit-slice circuit 30 of the correction unit denoted as an A-circuit is provided. Circuit 30 comprises six one-bit latches 25a–f designated S1, S2, q, p, u and v, each storing one bit of the named variables. Circuit 30 also comprises nine multiplexor circuits 26a–i and one exclusive OR (XOR) gate 27. Multiplexor circuits 26a and 26b are used for loading and shifting syndrome inputs. Multiplexors 26d, 26e, 26g are used for multiplexing the factors that enter into multipliers M1 and M2 (FIG. 10). Multiplexor 26i multiplexes the inputs to XOR gate 27. Multiplexor 26c switches the p latch 25d to serve as an intermediate storage for the previous q value in latch 25c. Multiplexors 26f and 26h modify or shift the data from the u and p latches 25d and 25e, respectively. XOR gate 27 is used to implement the summation v+e·u or q+e·p.

Circuit 30 constitutes a completely operational one-bit unit implementation for the key equation solver algorithm.

As shown in FIG. 10, eight bit-slice A-circuits 30 labelled A0–A7 plus the two multipliers M1 and M2, constitute a byte-slice B-circuit 40. Circuit 40 can be divided into these eight bit slice A-circuits 30 because the only interaction between the various bit positions occurs during multiplication operations. An eight-input OR gate 41 and a succeeding latch 25g are involved in determining the error location degree and the proper positioning of error locator vector v for the iterative Chien searcher circuit 15 (FIG. 1).

Clock and Control Circuitry

The complete control and clock circuitry is depicted in FIGS. 11–16.

Figure 11:
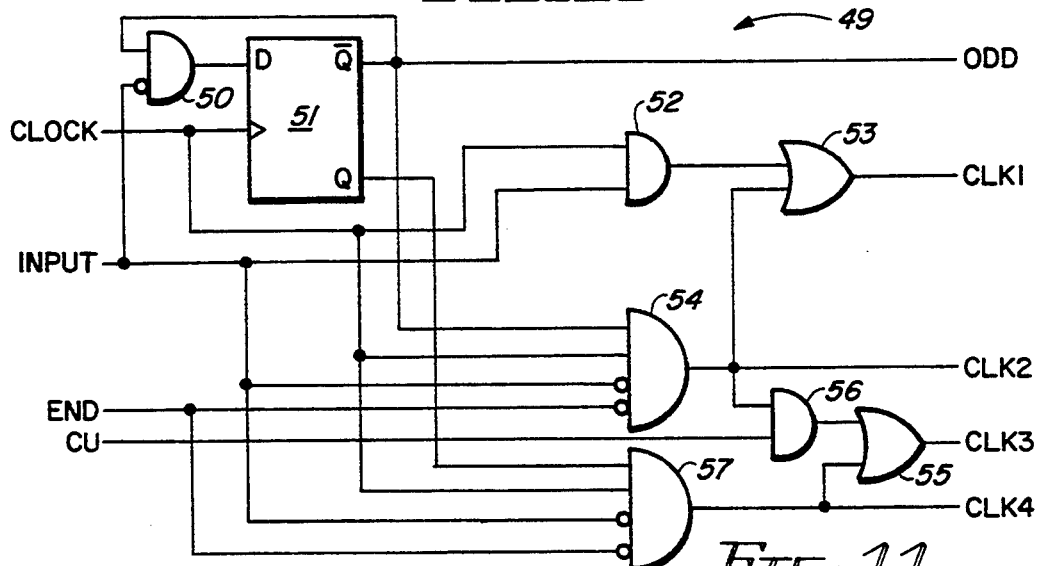
FIG. 11 is a schematic diagram of a clock generation circuit.
Figure 14:
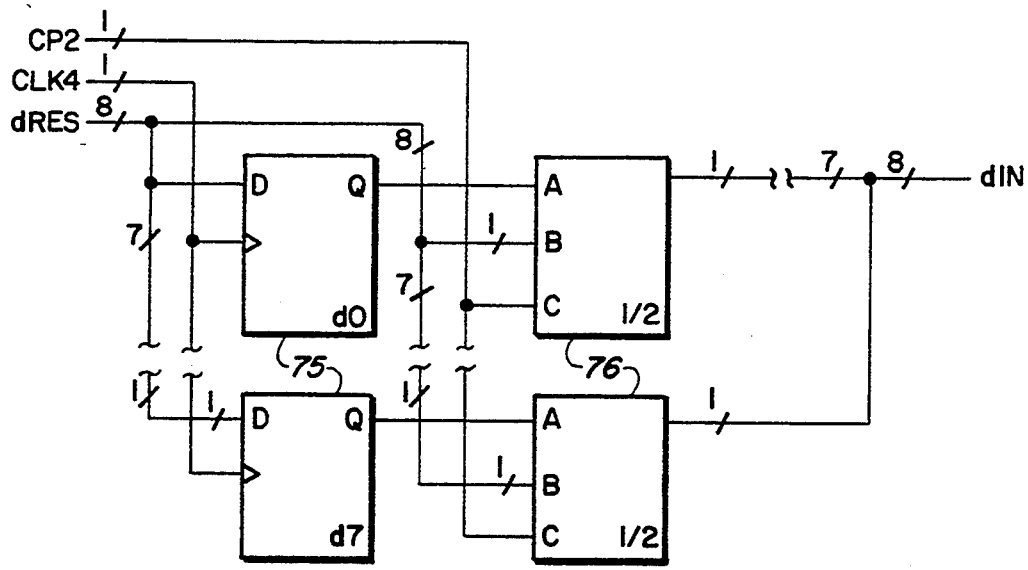
FIG. 14 is a schematic diagram of a circuit depicting the result of the inversion by the circuit of FIG. 13.

The clock generator circuit 49 shown in FIG. 11 generates four clock signals CLK1 to CLK4 from the main CLOCK. The input signals which control the clock generator circuit are INPUT, END and CU. The INPUT signal is activated only before the start of the computation. While INPUT=1, only the contents of the syndrome latches 25a, 25b can be modified. The END signal disables all clocks and therefore freezes the content of all latches, except for latch 51 (whose output is the ODD signal) after the completion of the computation. INPUT and END are both 0 during the actual computation.

The main enabling signal that controls all four clocking signals is ODD. It is an alternating signal that allows distinguishing between the two different operational cycles, odd and even, that as shown in FIG. 6, constitute one iteration.

The ODD signal is generated as the output of latch 51 which is enabled by the main system CLOCK. The input to latch 51 is obtained from the inverted value of INPUT and the ODD output through AND gate 50. During an odd operational cycle (ODD=1), the contents of the e, q, S1 and S2 latches are modified while CLK2=1. The CLK2 signal is obtained as the output of AND gate 54. The enabling clock signal CLK1, obtained as the output of OR gate 53, is identical to CLK2 during the computation but is also enabled by INPUT for loading the contents of the S1 and S2 syndrome latches 25a, 25b, respectively. INPUT also guarantees that each computation starts with an odd operational cycle, implemented by AND gate 50.

During an even operational cycle (ODD=0), the contents of the u and v latches 25e, 25f are modified while CLK4=1. CLK4 is obtained as the output of AND gate 57. Since the p latches 25d are used for both the storage of the coefficients of the p polynomial, during an odd cycle, as well as for the temporary storage of the last values of the coefficients of the q polynomial during a switch from Step 2 to Step 4 (which occurs during an even cycle), a separate enabling clock CLK3 is generated. CLK3 is generated as the output of OR gate 55 from either a CLK4 or a CLK2 enabled by the control signal CU.

The control signal circuitry 59 is shown in FIG. 12. The output VALID of latch 61 controls whether a counter 65 for the scalar variable R is upcounting; i.e., whether the algorithm executes Step 2 (VALID=1) or is downcounting (Step 4, VALID=0). This latch 61 is enabled by CLK2 and its input is generated as the output of OR gate 64. This gate is activated either when e=0 and VALID=1 (i.e., while the algorithm executes Step 2) or when R=0 and VALID=0. VALID switches from 1 to 0 if e≠0; and it switches back from 0 to 1 if R=0. It can only be changed during an odd operation cycle which occurs when CLK2=1.

The control signal CU=1 indicates that the latest e value does not equal 0 but that the status of the VALID latch is still 1; i.e., that the algorithm is executing Step 3 (B-sequence). While CU=1 and until VALID switches back to 0, no B-sequence can be started. This effectively implements the branching condition which prohibits the occurrence of consecutive B-B sequences and hence the repetition of Step 3.

The CU signal, generated as the output of AND gate 60, is active for one odd and the succeeding even operational cycle and is used for controlling the modification of the content of the u latches 25e. If CU(=1) is active at the end of a computation (Step 3) or VALID=0 (Step 4), the errors are NOT CORRECTABLE which is indicated by WRONG=1, a signal generated as the output of OR gate 67.

The output of latch 66 is equal to the signal CU, delayed by two operational cycles. The signal CP1 is active during an even operational cycle while the output of latch 66 is active. It controls whether the p latches 25d are used for storing the coefficients of the p polynomial (CP1=0) or for temporary storage of the last coefficients of the q polynomial (CP1=1). CP1 is generated as the output of AND gate 62. Signal CP2 is active only during the odd operational cycle while CU is active. CP2 is generated as the output of AND gate 63. CP2 controls the modification of the p latches 25d and of one of the factors of the first multiplier M1F1 (FIG. 10); namely, v, if CP2=0 or p while it stores the coefficients of the last q polynomial if CP2=1.

FIG. 13 depicts a circuit 70 that computes the inverse of the discrepancy value e. This circuit comprises multiplexors 71 and a ROM lookup inversion table 72. Multiplexors 71 allow sharing of table 72. The output dRES of ROM inversion table 72 is stored in an 8-bit register 75 comprising eight latches, like 25, shown in FIG. 14. Register 75 is controlled through eight multiplexors 76 by CP2. CP2 determines whether the value dRES is used directly for the modification of the u latch 25e, or is used later for the modification of p latch 25d.

Figure 15:
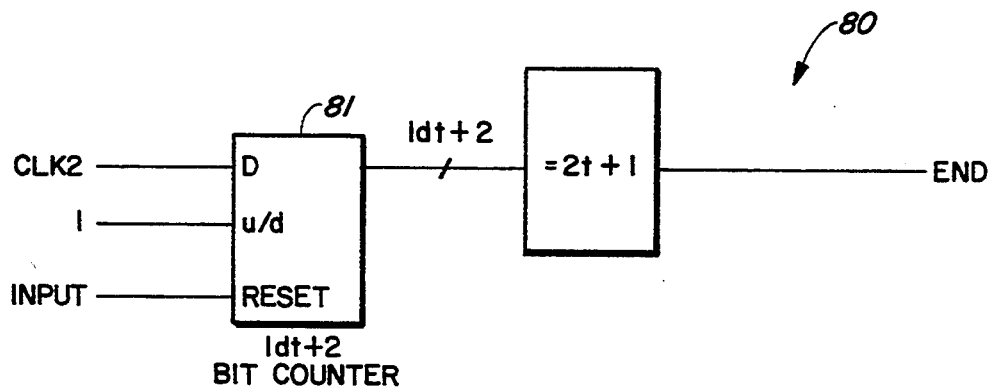
FIG. 15 is a schematic diagram of a termination circuit, for terminating the computation after 2t iterations.

As illustrated in FIG. 15, a termination circuit 80 comprises a counter 81 that counts the CLK2 signals and stops the computation after 2t+1 iterations.

FIG. 16A tabulates the Boolean equations for the four clock signals CLK1–CLK4 generated by circuit 49, previously described and shown in FIG. 11. FIG. 16B is a matrix whose columns are the distinct latch labels, S, u, v, u, q, and p and whose rows correspond to the distinct arithmetic operations performed on them during the algorithm execution. The matrix entries indicate the control or clock signals which are activated during specific operations performed on a specific register. FIGS. 16A and 16B summarize the control and clocking operations previously described in detail.

Figure 18:
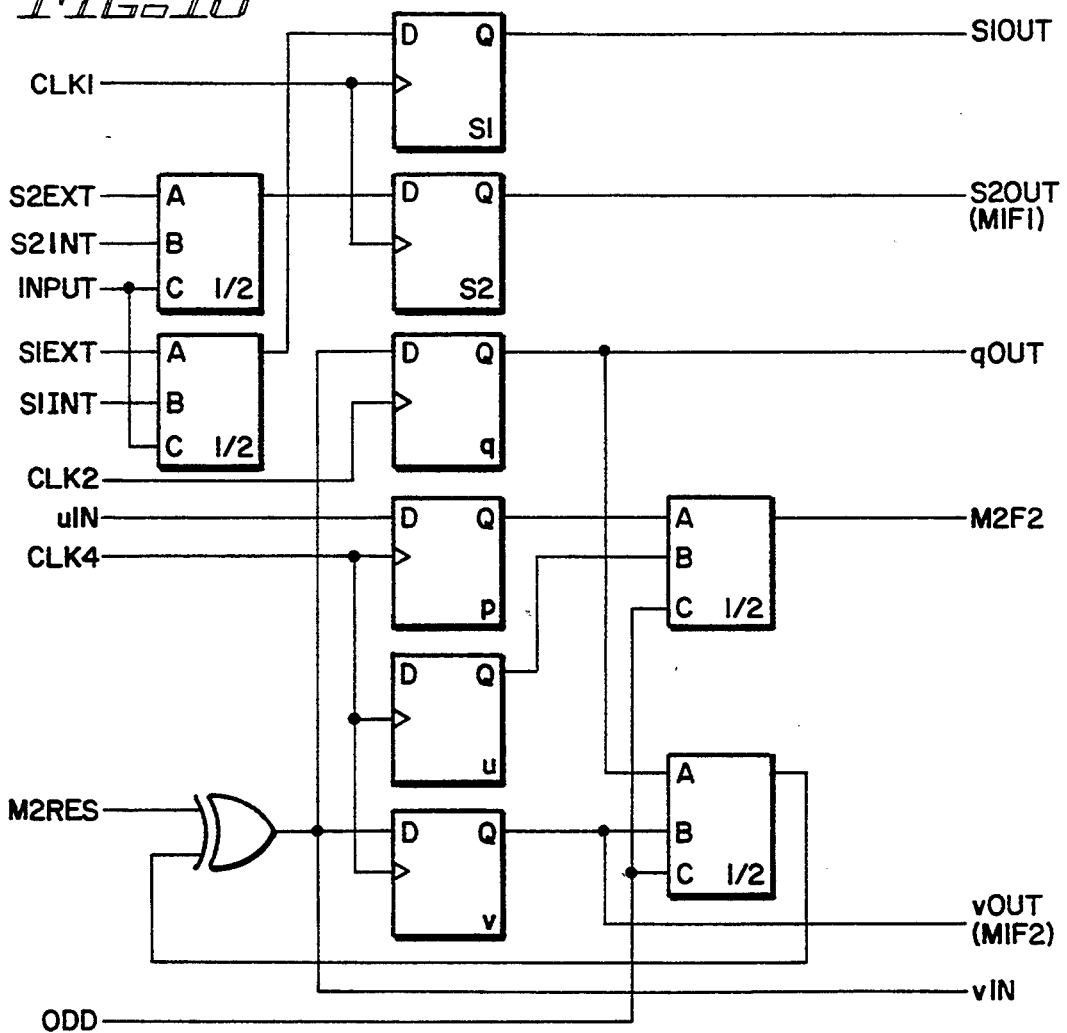
FIG. 18 is a schematic diagram of a terminal column bit slice circuit.
Figure 19:
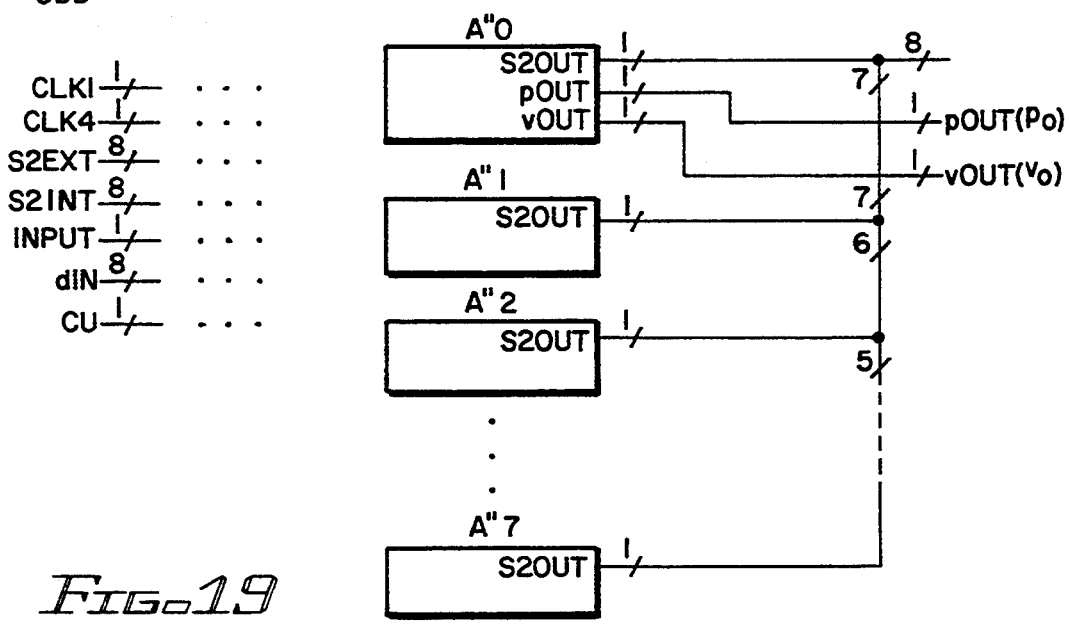
FIG. 19 is a schematic diagram of an initial byte slice of the error correction unit.

It should be noted that for implementing applicants' invention, the bit-slice A-circuit 30 described in FIG. 9 and the byte-slice B-circuit 40 described in FIG. 10 are deemed sufficient. However, for the sake of completeness and to reduce hardware complexity, FIGS. 17A/17B and FIG. 18 illustrate how the bit-slice A-circuit can be simplified for the initial and final column, respectively. Note that there is one circuit like in FIG. 17A and seven like in FIG. 17B for an 8-bit byte. FIGS. 19 and 20 describe the initial B0 and terminal Bt byte slice B-circuits respectively. These hardware simplifications can be achieved because in the initial step, the computation is trivial and does not require any multiplications and in the last step the algorithm does not require all the operations.

Finally, FIG. 21 schematically shows a correction unit 84 for t=8 error corrections. As earlier noted, the correction unit 84 in combination with the clock generation circuitry 49 and control signal circuitry consists of an initial byte slice B0-circuit, seven regular B-circuits and a terminal B8-circuit. An e-register 85 and a (t+1)-input adder 86, are part of this unit.

While the invention has been shown and described with respect to a preferred embodiment thereof, it will be understood by those skilled in the art that changes in form and detail may be made in this embodiment without departing from the scope and teaching of the invention. Accordingly, the apparatus and method herein disclosed are to be considered merely as illustrative, and the invention is to be limited only as specified in the claims.

We claim:

1. A method of implementing a parallelized algorithm for solving the key equation for the decoding of a linear algebraic code, said method comprising the steps of:

providing computation sequences for performing respective discrepancy value computations, one sequence executing only three multiplication operations and the other sequence executing only five multiplication operations, 2t iterations of these two sequences being required to decode t symbols in error; and coupling said sequences for, during a pair of successive 2t iterations, executing for all sequences of discrepancy values no more than four pairs of multiplication operations, with each pair performed as two parallel multiplications, in such manner that the fifth multiplication operation in said other sequence is combined with a multiplication operation in the next execution of said one sequence and two consecutive executions of said other sequence are prevented regardless of the nature of any errors in the information being decoded, as manifested by the sequences of discrepancy values.

2. The method of claim 1, including the step of:

executing an inverse table look up operation during one of said combined multiplication operations and executing an addition operation during another of said multiplication operations.

* * * * *